(12) United States Patent
Kim et al.

(10) Patent No.: US 9,791,731 B2
(45) Date of Patent: Oct. 17, 2017

(54) CONDUCTIVE COATING COMPOSITION AND DISPLAY DEVICE INCLUDING THE SAME

(71) Applicant: LG DISPLAY CO., LTD., Seoul (KR)

(72) Inventors: Taeheon Kim, Seoul (KR); Geesung Chae, Incheon (KR); Sunghee Kim, Paju-si (KR); Junsik Hwang, Seoul (KR); Chulhong Kim, Goyang-si (KR); Kwihong Park, Paju-si (KR); Taehwan Jun, Ilsan-gu (KR); Yuseon Kho, Seoul (KR); Kilsuk Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 290 days.

(21) Appl. No.: 14/134,303

(22) Filed: Dec. 19, 2013

(65) Prior Publication Data

US 2014/0293156 A1    Oct. 2, 2014

(30) Foreign Application Priority Data

Mar. 28, 2013 (KR) .................. 10-2013-0033294

(51) Int. Cl.

| | | |
|---|---|---|
| *G02F 1/1333* | (2006.01) | |
| *G06F 3/041* | (2006.01) | |
| *H01B 1/12* | (2006.01) | |
| *G06F 3/044* | (2006.01) | |
| *G02F 1/1343* | (2006.01) | |
| *H01L 51/00* | (2006.01) | |

(52) U.S. Cl.
CPC .......... *G02F 1/13338* (2013.01); *G06F 3/044* (2013.01); *G06F 3/0412* (2013.01); *H01B 1/12* (2013.01); *H01L 51/0037* (2013.01); *G02F 2001/134372* (2013.01); *G02F 2202/22* (2013.01); *G06F 2203/04103* (2013.01); *H01L 51/0021* (2013.01); *Y10T 428/1055* (2015.01)

(58) Field of Classification Search
CPC ..... G02F 1/13338; G02F 2001/134372; G02F 3/0412; H01B 1/12; H01L 51/0021; H01L 51/0037; G06F 3/0412; Y10T 428/1055

See application file for complete search history.

(56) References Cited

U.S. PATENT DOCUMENTS

| | | | | |
|---|---|---|---|---|
| 2004/0242792 | A1* | 12/2004 | Sotzing ................. | B82Y 30/00 525/326.1 |
| 2007/0221916 | A1* | 9/2007 | Shkunov ................. | C08K 5/54 257/40 |
| 2010/0193219 | A1* | 8/2010 | Mashimo ................ | G06F 3/041 174/126.1 |
| 2010/0247870 | A1* | 9/2010 | Suzuki .................. | B22F 1/0059 428/172 |
| 2011/0228188 | A1* | 9/2011 | Kim ..................... | G02F 1/13338 349/43 |

(Continued)

FOREIGN PATENT DOCUMENTS

| | | |
|---|---|---|
| JP | 2005082768 A | 3/2005 |
| KR | 1020090053615 A | 5/2009 |
| KR | 20110083381 A | 7/2011 |

*Primary Examiner* — Sophie Hon
(74) *Attorney, Agent, or Firm* — Seed Intellectual Property Law Group LLP

(57) ABSTRACT

A conductive coating composition includes 0.1 to 10 parts by weight of a conductive polymer, 5 to 30 parts by weight of polysilazane, and 30 to 60 parts by weight of a solvent.

8 Claims, 5 Drawing Sheets

(56) References Cited

U.S. PATENT DOCUMENTS

2012/0313055 A1* 12/2012 Yukinobu ................ C09D 5/24
  252/519.5
2013/0306943 A1* 11/2013 Kato ...................... C09J 139/06
  257/40

* cited by examiner

CONDUCTIVE COATING COMPOSITION AND DISPLAY DEVICE INCLUDING THE SAME

This application claims the benefit of priority to Korean Patent Application No. 10-2013-0033294 filed on Mar. 28, 2013, which is incorporated herein by reference for all purposes as if fully set forth herein.

BACKGROUND

Field of the Disclosure

Embodiments of the disclosure relates to a conductive coating composition. More particularly, the disclosure relates to a conductive coating composition for manufacturing a conductive transparent film used in a display device, and a display device including the same.

Discussion of the Related Art

Recently, various input devices such as keyboards, mice, trackballs, joysticks, and digitizers have been used to constitute an interface between a user and home appliances or various types of data communication equipment. However, the use of the input devices causes inconvenience such as learning of how to use the input devices and occupying of spaces. Accordingly, there is an aspect of difficulty in an increase of the degree of completion of products. Accordingly, a demand for an input device that is convenient and simple and is capable of reducing a misoperation is growing day by day. A touch panel inputting information by allowing a user's finger or a pen to directly touch a screen by a user has been proposed in accordance with the demand.

The touch panel is applied to various display devices because the touch panel is simple, has less misoperation, is capable of performing inputting without using a separate input apparatus, and has convenience that the user is capable of rapidly and easily operating the products through a content displayed on the screen.

The touch panel may be divided into an upper plate add-on type, an upper plate on-cell type, and a panel in-cell type according to a structure thereof. The upper plate add-on type is a type where the display device and the touch panel are individually manufactured and the touch panel is then attached to an upper plate of the display device. The upper plate on-cell type is a type where elements constituting the touch panel are directly formed on a surface of an upper glass substrate of the display device. The panel in-cell type is a type where the elements constituting the touch panel are directly formed in the display device.

Among the types, in the display device provided with the panel in-cell type touch panel, a back electrode is formed of ITO as a transparent conductive material on a back surface of a color filter substrate to prevent a problem occurring by static electricity when a module process is performed. Accordingly, even though an in-cell type capacitive touch sensor is provided in the display device, there is a problem in that a change in capacitance by a touch of the user is not sensed due to the back electrode to cause a malfunction. That is, when the user's finger touches the screen, a capacitance occurs between the user's finger and the back electrode. The capacitance is discharged to the outside through the back electrode, and thus the touch is not recognized.

Accordingly, there is a demand for solving a problem of non-recognition of the touch due to the back electrode.

SUMMARY

A conductive coating composition includes 0.1 to 10 parts by weight of a conductive polymer, 5 to 30 parts by weight of polysilazane, and 30 to 60 parts by weight of a solvent.

A method of manufacturing a substrate for a display device includes preparing a substrate, applying a conductive coating composition including 0.1 to 10 parts by weight of a conductive polymer, 5 to 30 parts by weight of polysilazane, and 30 to 60 parts by weight of a solvent on the substrate, and annealing the conductive coating composition.

A display device includes a thin film transistor array substrate on which a pixel electrode and a common electrode are formed, a color filter array substrate facing the thin film transistor array substrate, a liquid crystal layer interposed between the thin film transistor array substrate and the color filter array substrate, and a back electrode positioned on the color filter array substrate, wherein the back electrode is formed of a mixture material of a conductive polymer and polysilazane.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EXEMPLARY EMBODIMENTS

Figure 1:
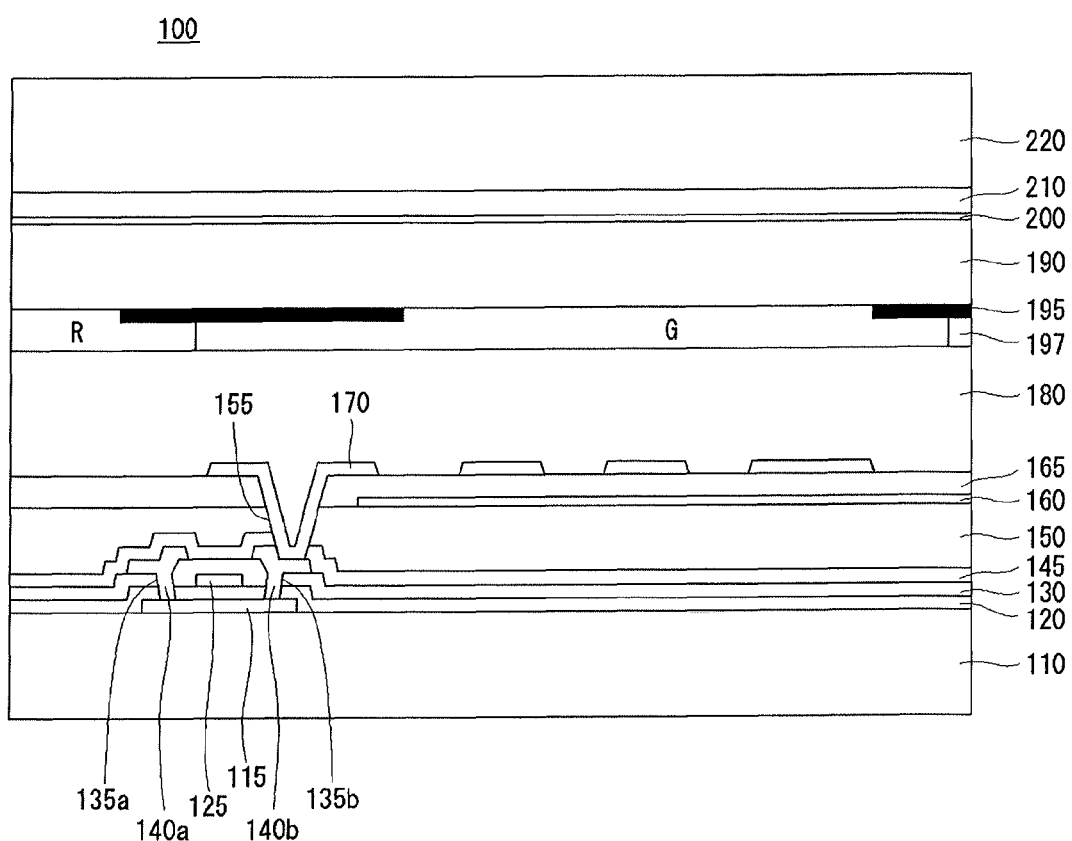
FIG. 1 is a cross-sectional view showing a display device according to an exemplary embodiment of the disclosure.

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

A conductive coating composition disclosed in the disclosure includes a conductive polymer, polysilazane, and a solvent.

The conductive polymer is constituted to prevent static electricity of a substrate of a display device and secure transmittance and hardness applied to the display device.

The conductive polymer is an organic polymer having lightness in weight, easiness of processability, and electrification as intrinsic properties of the polymer, and has a conjugated bond including a single bond and a double bond alternately formed. The conductive polymer according to the disclosure includes a conductive polymer doped with another appropriate material as well as a pure conductive polymer.

Examples of the conductive polymer include a conductive polymer not including a hetero atom, such as polyfluorene, polyphenylene, polypyrene, polyazulene, polynaphthalene, polyacetylene (PAC), and poly(p-phenylene vinylene) (PPV); a conductive polymer including nitrogen (N) as the hetero atom, such as polypyrrole (PPY), polycarbazole, polyindole, polyazepine, poly(thienylene vinylene), and polyaniline (PANI); a conductive polymer including sulfur (S) as the hetero atom, such as poly(thiophene) (PT), poly (p-phenylene sulfide) (PPS), and poly(3,4-ethylenedioxy thiophene) (PEDOT); a conductive polymer including oxygen (O) as the hetero atom, such as polyfuran, and a conductive material in which the conductive polymers are doped with other materials. The conductive polymers may have a form substituted by an appropriate substituent group, for example, an aromatic cycle as well as an aliphatic group such as an alkyl group and an alkoxy group.

The conductive polymer doped with another material to improve dispersibility to the solvent or conductivity, or a material substituted with an appropriate functional group may be used as the conductive polymer. For example, halogen gas such as $I_2$ and $Br_2$, alkali metal such as Li and Na, and $AsF_6$ may be used as a dopant in polyacetylene as the conductive polymer. Further, $BF_4^-$ and $ClO_4^-$ may be used as the dopant of polypyrrole, polythiophene, polyazulene, and polyfuran. $AsF_6$ may be used as the dopant of polyphenylene sulfide, polyphenylenevinylene, polythienylenevinylene, and polyphenylene in addition to polyacetylene. Meanwhile, hydrochloric acid (HCl), dodecyl benzene sulfonic acid (DBSA), and camphorsulfonic acid (CSA) may be used as the dopant of polyaniline. In the case of polypyrrole, a tosyl group such as p-methylphenyl sulfonate in addition to $BF_4^-$ and $ClO_4^-$ may be used as the dopant. In the case of polythiophene, the tosyl group such as p-methylphenyl sulfonate and $FeCl_4$ may be used as the dopant. In the case of polyphenylene, alkali metal such as Li and K in addition to $AsF_6$ may be used as the dopant.

Particularly, examples of the conductive polymer of the disclosure may include a conductive polymer including PEDOT as a main component. Examples thereof include unsubstituted PEDOT, poly(3,4-ethylenedioxy thiophene) (PEDOT:PSS) doped with poly(styrene sulfonate), or poly (3,4-ethylenedioxy thiophene)-tetramethacrylate (PEDOT-TMA).

The sulfonic acid group of PSS in PEDOT:PSS is deprotonated in the solvent to have a negative electric charge, and may act as a dispersing element. Meanwhile, PEDOT is a n conjugated system conductive polymer and a PEDOT portion has a positive electric charge. Accordingly, PEDOT may have favorable dispersibility to particularly a hydrophilic solvent to form a stable salt form. When EDOT as a monomer of PEDOT is added to an appropriate solvent such as water in the presence of PSS, an acid water-dispersible solution is formed. Accordingly, the PEDOT:PSS solution may cause oxygen polymerization to form a stable dispersing element. PEDOT-TMA as another conductive polymer has excellent dispersibility to an organic solvent and is not corroded. Accordingly, PEDOT-TMA may be used instead of PEDOT:PSS.

The conductive polymer may be included in a content of 0.1 to 10 parts by weight in the conductive coating composition of the disclosure based on 100 parts by weight of the conductive coating composition. When the content of the conductive polymer is 0.1 parts by weight or more, the conductive polymer may act as a back electrode of the substrate to secure conductivity for preventing static electricity. When the content of the conductive polymer is more than 10 parts by weight, there is an advantage in that transmittance is prevented from being reduced.

Meanwhile, polysilazane usable in the conductive coating composition of the disclosure is a matrix for preventing deterioration in properties of the conductive polymer due to permeation of oxygen and moisture, and may have a repeating unit of the following Chemical Formula.

[Chemical Formula]

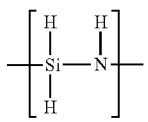

Polysilazane used in the disclosure is capable of being used as long as polysilazane is manufactured by a known method. Examples of a method of manufacturing polysilazane may include a method of reacting dihalosilane of a Chemical Formula of $SiH_2X_2$ (herein, X is a halogen atom) and a base to form an addition of dihalosilane and then reacting the addition of dihalosilane and ammonia to synthesize polysilazane. In general, halosilane is acidic, and may be reacted with the base to form the addition. A forming speed of the addition and stability as the addition depend on acidity strength of halosilane, basicity strength of a basic material, or a steric factor. Accordingly, a stable addition, which is capable of easily manufacturing inorganic polysilazane by a reaction with ammonia, may be formed by appropriately selecting a type of halosilane and a type of the base.

For halosilane, it is preferable to select dihalosilane of the Chemical Formula of $SiH_2X_2$ (herein, X is F, Cl, Br, or I) in views of a handling property or reactivity. It is particularly preferable to use dichlorosilane in views of reactivity and a price of raw materials.

The based used to form the addition is favorable as long as the base does not cause a reaction other than the reaction of forming halosilane and the addition. Preferable examples thereof may include a Lewis base, tertiary amines (trialkylamine), pyridine, picoline, and a derivative thereof, and secondary amines having a steric hindrance group, phosphine, arsine, and a derivative thereof (for example, trimethylphosphine, dimethylethylphosphine, methyldiethylphosphine, trimethylarsine, trimethylstibine, trimethylamine, triethylamine, thiophene, furan, dioxane, and selenophene). Particularly, pyridine and picoline are preferable in views of the handling property and economic feasibility. The amount of the used base does not need to be particularly strict, and is enough as long as the amount of the base is an amount when the base is present in an amount exceeding a stoichiometric amount of amine, which is included in the addition, to silane, that is, an amount of amine:silane=2:1. Further, an addition generation reaction is performed in the solvent.

In synthesis of polysilazane via the addition, the addition and ammonia are reacted in an unreactive solution to form polysilazane. A reaction condition is typically −78 to 100° C., and not particularly limited by a reaction time and a reaction pressure. Further, a polymerization reaction of polysilazane is performed in an inert gas atmosphere. Nitrogen or argon is appropriate as inert gas.

To summarize synthesis of polysilazane, the synthesis may be represented by the following Reaction Equation. Dichlorosilane as halosilane is reacted with amine to manufacture aminosilane as the addition, condensation is performed together with water and a catalyst to manufacture a polymer having a Si—N repeating unit, and oxygen atoms (O) are bonded between Si and Si to manufacture polysilazane.

[Reaction Equation]

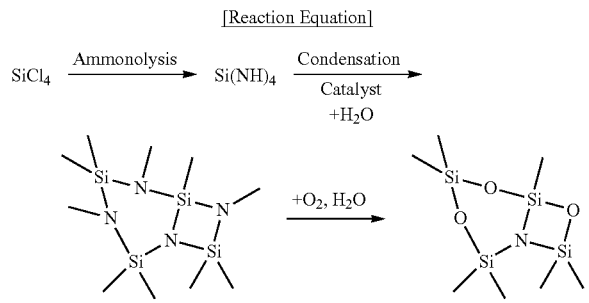

Manufactured polysilazane has the repeating unit of the aforementioned Chemical Formula, and in general, polysilazane having a number average molecular weight in the range of 600 to 3000 may be used. Polysilazane is included in a content of 5 to 30 parts by weight based on 100 parts by weight of the conductive coating composition. When the content of polysilazane is 5 parts by weight or more, a reduction in stability of the coating composition due to an excessive increase in content of solids may be prevented. When the content of polysilazane is 30 parts by weight or less, viscosity may be secured so that a coating film to be manufacture is formed to have a desired thickness.

Meanwhile, the solvent constituting the conductive coating composition of the disclosure is used to disperse the conductive polymer and polysilazane and adjust the viscosity of the coating composition. For example, when the conductive polymer is a hydrophilic polymer, a hydrophilic solvent may be used as the solvent dispersing the conductive polymer and polysilazane. As specific examples of the usable hydrophilic solvent, an organic solvent selected from water; alcohols such as ethanol, methanol, isopropyl alcohol, butanol, 2-ethylhexyl alcohol, methoxypentanol, butoxyethanol, ethoxyethoxyethanol, butoxyethoxyethanol, methoxypropoxypropanol, texanol, and terpineol such as α-terpineol; tetrahydrofuran (THF); glycerol, alkylene glycol, for example, ethylene glycol, triethylene glycol, polyethylene glycol, propylene glycol, dipropylene glycol, dihexylene glycol, or alkyl ether thereof (for example, propylene glycol methyl ether (PGME), diethylene glycol butyl ether, diethylene glycol ethyl ether, dipropylene glycol methyl ether, and dihexylene glycol ethyl ether); glycerin, N-methylpyrrolidinone (N-methyl-2-pyrrolidinone, NMP), 2-pyrrolidinone, acetylacetone, 1,3-dimethylimidazolinone, thiodiglycol, dimethyl sulfoxide (DMSO), N,N-dimethyl acetamide (DMAc), dimethylformamide (DMF), sulfolane, diethanolamine, and triethanolamine may be used alone, or by mixture of two types or more thereof. For example, when PEDOT:PSS is used as the conductive polymer, if the hydrophilic solvent having high polarity is used alone or by mixture, PEDOT:PSS may act as an expansion agent well dispersing the conductive polymer.

When the conductive polymer having hydrophobicity is used, a hydrophobic solvent may be used. For example, ketones such as methyl ethyl ketone and cyclopentanone, aromatic compounds such as xylene, toluene, or benzene, ethers such as dipropylene methyl ether, and aliphatic hydrocarbons such as methylene chloride and chloroform may be used alone or by mixture of two types or more thereof.

The solvent may be included in a content of 30 to 60 parts by weight based on 100 parts by weight of the conductive coating composition according to the disclosure. When the content of the solvent is 30 parts by weight or more, the conductive polymer and polysilazane may be uniformly dispersed. When the content of the solvent is 60 parts by weight or less, the viscosity of the coating composition may be appropriately maintained.

Accordingly, the conductive coating composition of the disclosure includes 0.1 to 10 parts by weight of the conductive polymer, 5 to 30 parts by weight of polysilazane, and 30 to 60 parts by weight of the solvent.

A display device using the conductive coating composition, a substrate for the display device, and a method of manufacturing the substrate for the display device will be described. FIG. 1 is a cross-sectional view showing a display device according to an exemplary embodiment of the disclosure.

Referring to FIG. 1, a display device 100 of the disclosure is exemplified by a panel in-cell type touch display device. A semiconductor layer 115 is positioned and a gate insulating film 120 covering the semiconductor layer 115 and insulating the semiconductor layer 115 is positioned on a thin film transistor array substrate 110. A gate electrode 125 is positioned in a region corresponding to the semiconductor layer 115 on the gate insulating film 120. Further, a gate wire (not shown) connected to the gate electrode 125 to unidirectionally extend is positioned on the gate insulating film 120.

An interlayer insulating film 130 insulating the gate electrode 125 is positioned on the gate electrode 125. The gate insulating film 120 and the interlayer insulating film 130 are formed of silicon oxides, silicon nitrides, or a multilayered structure thereof. Contact holes 135a and 135b through which both ends of the semiconductor layer 115 are exposed are provided in the interlayer insulating film 130 and the gate insulating film 120.

A source electrode 140a and a drain electrode 140b are positioned on the interlayer insulating film 130 to be connected to both exposed sides of the semiconductor layer 115 through the contact holes 135a and 135b. Accordingly, a thin film transistor including the semiconductor layer 115, the gate electrode 125, the source electrode 140a, and the drain electrode 140b is constituted. In the disclosure, a top gate type thin film transistor where the gate electrode is positioned on the semiconductor layer is described as an example. However, a bottom gate type thin film transistor where the gate electrode is positioned beneath the semiconductor layer may be applied, and various types of other thin film transistors may be provided.

Meanwhile, a first passivation film 145 is positioned on the thin film transistor array substrate 110 provided with the thin film transistor. A second passivation film 150 is formed of the same material as the gate insulating film 120 or the interlayer insulating film 130. The second passivation film 150 formed of an organic insulating material, for example, photoacryl or benzocyclobutene is positioned on the first passivation film 145. A common electrode 160 formed of a transparent conductive material and patterned for each pixel is positioned on the second passivation film 150. In the common electrode 160, a plurality of pixels constitutes one touch block. The touch block may have a size of about 1 to 10 mm² as a user's finger touching area. A sensing wire for touch sensing is connected to the common electrode 160.

A third passivation film 165 is positioned on the common electrode 160 to insulate the common electrode 160. The third passivation film 165 and the second passivation film 150 are provided with a via hole 155 through which the drain electrode 135b of the thin film transistor is exposed. A pixel electrode 170 connected to the drain electrode 135b is positioned on the third passivation film 165. The pixel electrode 170 is provided with a plurality of openings having a bar shape to generate a fringe field together with the common electrode 160 when a driving voltage is applied. The pixel electrode 170 and the common electrode 160 overlap each other to form a storage capacitor. Accordingly, the thin film transistor array substrate 110 provided with the thin film transistor, the pixel electrode, and the common electrode is constituted. Further, the pixel electrode 170 acts as a touch driving electrode and the common electrode 160 acts as a touch sensing electrode to perform driving as touch elements.

Meanwhile, a color filter array substrate 190 is positioned on the thin film transistor array substrate 110. A black matrix 195 is provided on an internal surface of the color filter array substrate 190 to correspond to a boundary of the pixels and the thin film transistor. Red, green, and blue color filters 197 corresponding to the pixels are positioned in regions divided by the black matrix 195. A liquid crystal layer 180 is interposed between the thin film transistor array substrate 110 and the color filter array substrate 190 having the aforementioned constitutions.

In addition, a back electrode 200 having high resistance for preventing static electricity and including the conductive polymer and polysilazane mixed with each other is positioned on an external surface of the color filter array substrate 190. Since the back electrode 200 is described in detail in the above, the description thereof will be omitted. A polarizer 210 is positioned on the back electrode 200, and a cover substrate 220 protecting internal elements from the outside is positioned on the polarizer 210 to constitute the display device 100 of the disclosure.

In the display device according to the exemplary embodiment of the disclosure, the back electrode 200 having high resistance, which is formed of the conductive polymer and polysilazane, is formed on the external surface of the color filter array substrate 190. Accordingly, static electricity generated during a manufacturing process may be discharged to the outside, and a capacitance may be easily formed between the finger and touch electrodes during a touch of the user's finger. That is, when the touch occurs by the user's finger, the back electrode 200 may act as an insulating layer having high resistance to form the capacitance between the finger and the touch electrodes.

In general, a small quantity of current flowing through a human finger has the intensity of about several nA to several µA. For the current having the aforementioned intensity, the back electrode 200 having high resistance acts as the insulating layer. On the other hand, static electricity has a momentary constant voltage of several thousands to several tens of thousands V. Accordingly, the back electrode 200 may act as an electric conductor to discharge static electricity to the outside.

Therefore, in the display device according to the exemplary embodiment of the disclosure, even though the back electrode is formed as a unit discharging static electricity generated during the manufacturing process to the outside on the color filter array substrate, the back electrode does not disturb formation of the capacitance when a user touches the electrode. Accordingly, an operation by the touch is feasible.

Hereinafter, a method of manufacturing the back electrode on the substrate for the display device by using the conductive coating composition will be described below.

Figure 2A:
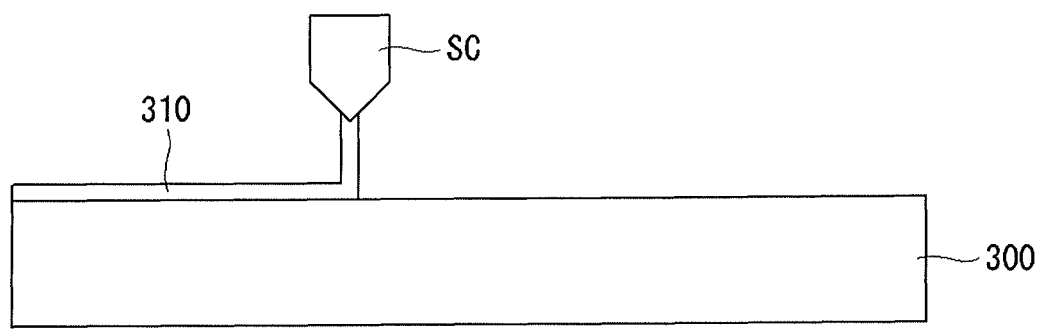
FIGS. 2a and 2b are views showing a method of manufacturing a substrate for the display device of the disclosure.
Figure 2B:
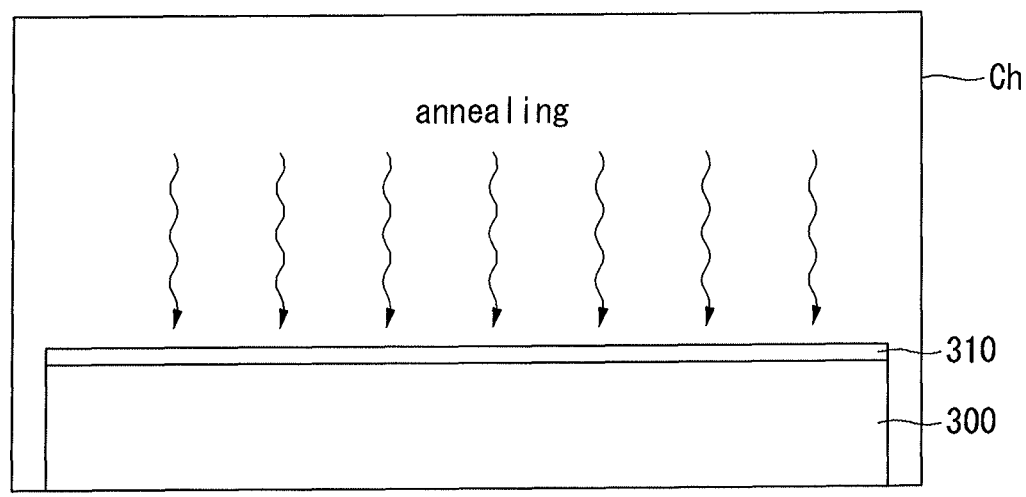

FIGS. 2a and 2b are views showing the method of manufacturing the substrate for the display device of the disclosure.

A conductive polymer solution, for example, a PEDOT:PSS solution, a polysilazane solution, and the solvent are prepared. In addition, the PEDOT:PSS solution and the polysilazane solution are mixed in a predetermined content in the solvent, put into an agitator, and agitated for several minutes to several hours to well disperse PEDOT:PSS and polysilazane in the solvent, thus manufacturing the conductive coating composition.

Referring to FIG. 2a, a manufactured conductive coating composition 310 is put into a slit coater device SC and applied on a substrate 300. A coating method of the conductive coating composition 310 is not limited to slit coating. The conductive coating composition may be formed by a spin coating method. Subsequently, referring to FIG. 2b, the substrate 300 coated with the conductive coating composition 310 is equipped in a chamber Ch, and then annealed at 100 to 200° C. for 1 to 30 minutes. The solvent in the conductive coating composition is removed by performing annealing to finally manufacture the back electrode including the conductive polymer and polysilazane mixed with each other.

Hereinafter, preferable Examples will be described in order to help understanding of the disclosure. However, the following Examples are set forth to illustrate but are not to be construed to limit the disclosure.

EXAMPLE 0.6 g of the PEDOT:PSS solution and 15 g of the polysilazane solution were added to the solvent including 39.4 g of water, 5 g of acetyl acetone, 20 g of isopropyl alcohol, and 20 g of propylene glycol methyl ether mixed with each other to manufacture the composition. The manufactured composition was stirred for about 24 hours to well disperse PEDOT:PSS and polysilazane in the solvent. Next, the manufactured composition was put into the slit coating device and applied on the glass substrate. Thereafter, the glass substrate was annealed in the chamber at the temperature of 140° C. for about 10 min to remove the solvent. Accordingly, the back electrode formed of PEDOT:PSS and polysilazane was formed on the glass substrate.

Figure 3:
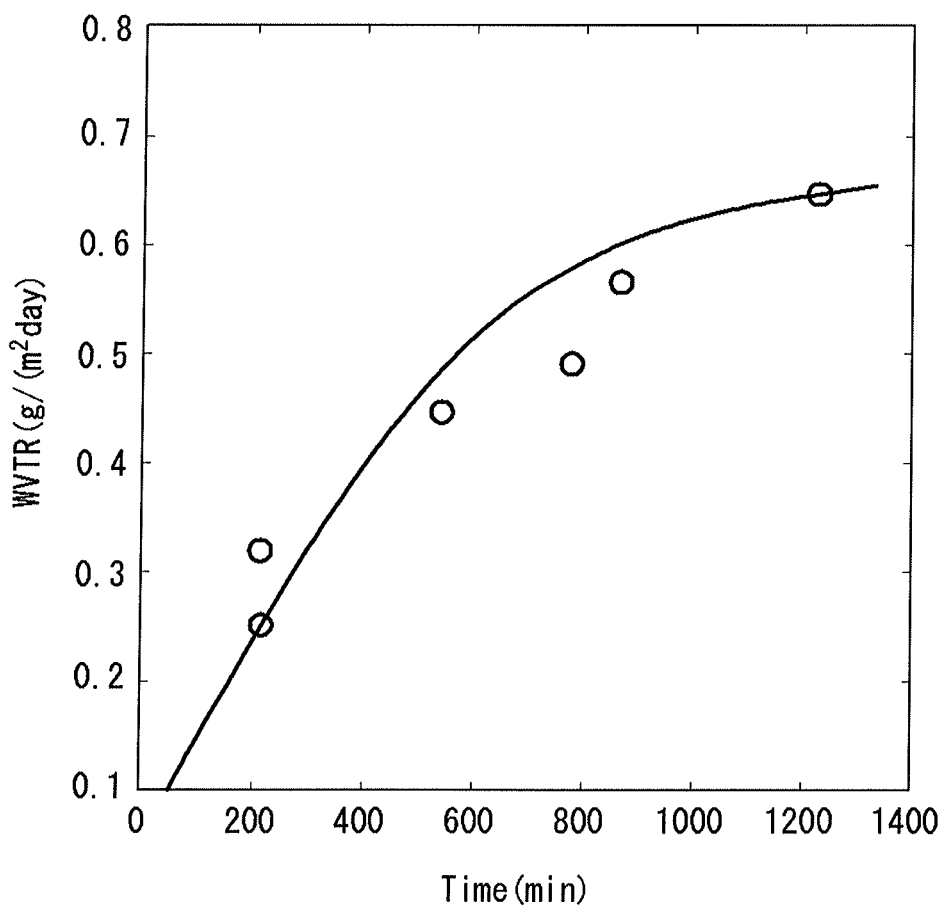
FIG. 3 is a graph shown by measuring vapor permeance WVTR of a back electrode, which is manufactured according to an Example of the disclosure, according to a time.
Figure 4:
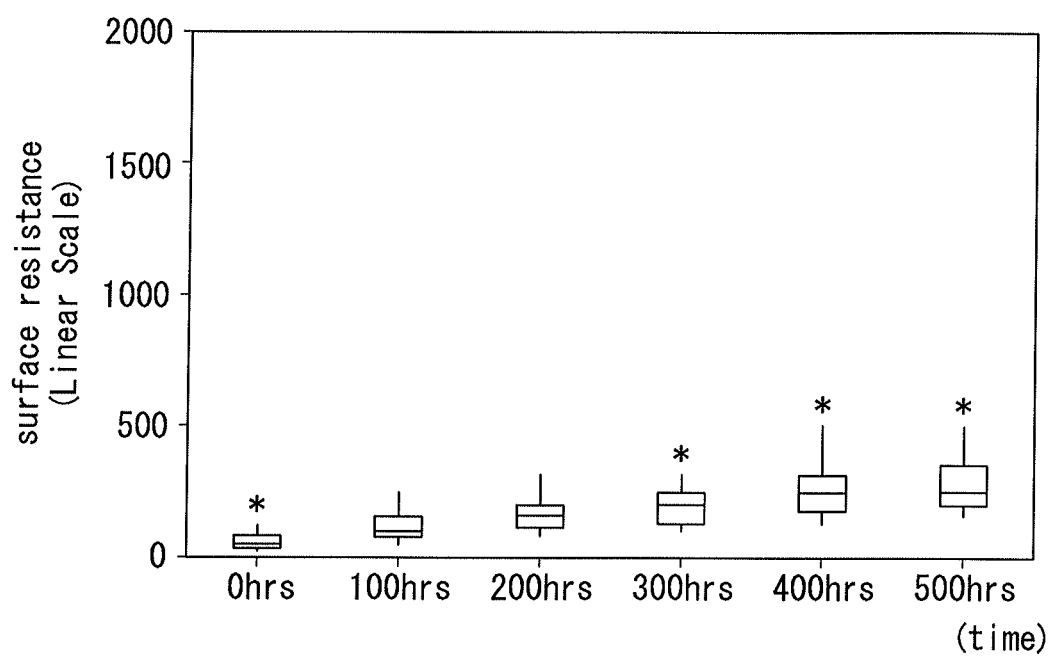
FIG. 4 is a graph shown by measuring surface resistance of the back electrode, which is manufactured according to the Example of the disclosure, according to the time in a high temperature condition of 80° C.
Figure 5:
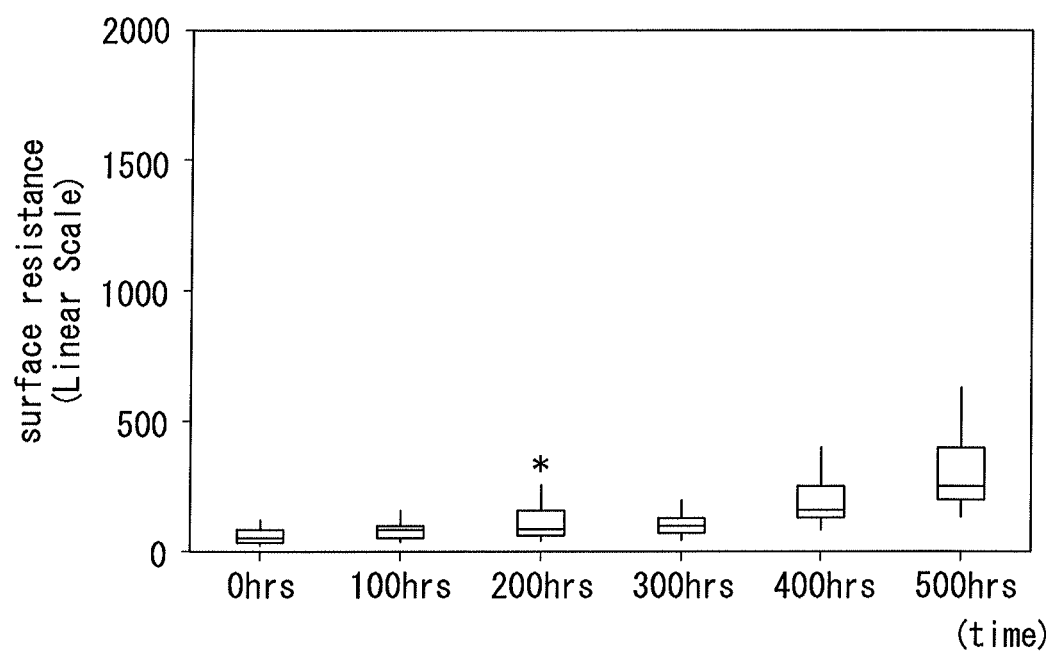
FIG. 5 is a graph shown by measuring surface resistance of the back electrode, which is manufactured according to the Example of the disclosure, according to the time in a condition of a high temperature of 60° C. and high humidity of 90%.

Vapor permeance WVTR of the manufactured back electrode according to the time was measured, and is shown in FIG. 3. Further, surface resistance of the back electrode according to the time in the high temperature condition of 80° C. was measured, and is shown in FIG. 4. Surface resistance of the back electrode according to the time in the condition of the high temperature of 60° C. and high humidity of 90% was measured, and is shown in FIG. 5.

Referring to FIG. 3, the vapor permeance was increased as time passed, but the vapor permeance was maintained at a predetermined level after 1000 minutes. It was confirmed that the vapor permeance was proportionally continuously increased as time passed in general conductive films but the vapor permeance was maintained at a predetermined level in the back electrode of the present application. Further, referring to FIGS. 4 and 5, it was confirmed that the surface resistance was not proportionally increased but maintained at a predetermined level as time passed even in the high temperature and high humidity condition. Through the aforementioned Example, it was confirmed that reliability of the back electrode manufactured by the conductive coating composition of the disclosure was excellent.

The conductive coating composition of the disclosure and the display device including the same have an advantage in that high temperature and high humidity reliability of the back electrode can be improved by forming the back electrode of the display device by a mixture of the conductive polymer and conductive polymer and polysilazane. Further, there is an advantage in that static electricity can be discharged to the outside and occurrence of a touch misoperation can be prevented by forming the back electrode having a high resistance.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device including a conductive coating composition having high resistance to static electricity, the device comprising: a pixel electrode and a common electrode that overlap each other to define a capacitor;
   a color filter array substrate over the capacitor;
   the conductive coating composition overlying the color filter array substrate, the composition comprising:
   0.1 to 10 parts by weight of a conductive polymer;
   wherein the conductive polymer has a repeating conjugated bond which includes a single bond and a double bond alternately formed, and has electrification as an intrinsic property;
   5 to 30 parts by weight of polysilazane;
   wherein the polysilazane has a number average molecular weight in the range of 600 to 3000;
   wherein the polysilazane has a repeating unit of the following Chemical Formula:

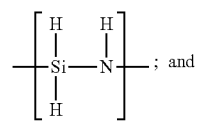
   [Chemical Formula]
   ; and 30 to 84.4 parts by weight of a mixture of water, acetyl acetone, isopropyl alcohol, and propylene glycol methyl ether.

2. The display device of claim 1, further comprising:
   a thin film transistor array substrate on which the pixel electrode and the common electrode are formed;
   the color filter array substrate facing the thin film transistor array substrate;
   a liquid crystal layer interposed between the thin film transistor array substrate and the color filter array substrate; and
   a back electrode positioned on the color filter array substrate,
   wherein the back electrode is formed of the conductive coating composition.

3. The display device of claim 2, wherein the conductive polymer is one or more selected from the group consisting of polyfluorene, polyphenylene, polypyrene, polyazulene, polynaphthalene, polyacetylene (PAC), poly(p-phenylene vinylene) (PPV), polypyrrole (PPY), polycarbazole, polyindole, polyazepine, poly(thienylene vinylene), polyaniline (PANI), poly(thiophene), poly(p-phenylene sulfide (PPS), poly(3,4-ethylenedioxy thiophene) (PEDOT), poly(3,4-ethylenedioxy thiophene) doped with poly(styrene sulfonate) (PSS) (PEDOT:PSS), poly(3,4-ethylenedioxy thiophene)-tetramethacrylate (PEDOT-TMA), polyfuran, and a combination thereof.

4. The display device of claim 1, wherein the pixel electrode is a touch driving electrode, and the common electrode is a touch sensing electrode.

5. A method of manufacturing a display device including a pixel electrode and a common electrode that overlap each other to define a capacitor, a color filter array substrate over the capacitor, and a conductive coating composition overlying the color filter array, the method comprising:
   preparing a substrate;
   applying a conductive coating composition including 0.1 to 10 parts by weight of a conductive polymer, 5 to 30 parts by weight of polysilazane, and 30 to 84.4 parts by weight of a solvent on the substrate; and
   annealing the conductive coating composition, in forming the display device;
   wherein the conductive polymer has a repeating conjugated bond which includes a single bond and a double bond alternately formed, and has electrification as an intrinsic property;
   wherein the polysilazane has a repeating unit of the following Chemical Formula:

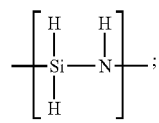
   [Chemical Formula]

wherein the polysilazane has a number average molecular weight in the range of 600 to 3000; and
   wherein the solvent is a mixture of water, acetyl acetone, isopropyl alcohol, and propylene glycol methyl ether.

6. The method of claim 5, wherein the conductive coating composition is applied by one of slit coating or spin coating.

7. The method of claim 5, wherein the annealing is performed at 100 to 200.degree. C. for 1 to 30 minutes.

8. The method of claim 5, wherein the conductive polymer is one or more selected from the group consisting of polyfluorene, polyphenylene, polypyrene, polyazulene, polynaphthalene, polyacetylene (PAC), poly(p-phenylene vinylene) (PPV), polypyrrole (PPY), polycarbazole, polyindole, polyazepine, poly(thienylene vinylene), polyaniline (PANI), poly(thiophene), poly(p-phenylene sulfide (PPS), poly(3,4-ethylenedioxy thiophene) (PEDOT), poly(3,4-ethylenedioxy thiophene) doped with poly(styrene sulfonate) (PSS) (PEDOT:PSS), poly(3,4-ethylenedioxy thiophene)-tetramethacrylate (PEDOT-TMA), polyfuran, and a combination thereof.

* * * * *